United States Patent [19]

Mead

[11] Patent Number: 5,289,023

[45] Date of Patent: Feb. 22, 1994

[54] HIGH-DENSITY PHOTOSENSOR AND CONTACTLESS IMAGING ARRAY HAVING WIDE DYNAMIC RANGE

[75] Inventor: Carver A. Mead, Pasadena, Calif.

[73] Assignee: Synaptics, Incorporated, San Jose, Calif.

[21] Appl. No.: 927,079

[22] Filed: Aug. 7, 1992

Related U.S. Application Data

[63] Continuation-in-part of Ser. No. 923,734, Jul. 30, 1992, which is a continuation-in-part of Ser. No. 760,569, Sep. 16, 1991, Pat. No. 5,260,592, which is a continuation-in-part of Ser. No. 657,128, Feb. 19, 1991, Pat. No. 5,097,305.

[51] Int. Cl.$^5$ ............................................. H01L 27/14
[52] U.S. Cl. ................................. 257/291; 257/292; 257/443; 257/448; 257/458
[58] Field of Search .............. 257/290, 291, 292, 293, 257/294, 443, 458, 448, 462; 307/311; 250/370.01

[56] References Cited

U.S. PATENT DOCUMENTS

| | | | |
|---|---|---|---|
| 3,470,318 | 9/1969 | Webb | 178/7.1 |
| 3,617,823 | 11/1974 | Hofstein | 317/235 |
| 3,909,520 | 9/1975 | Mend et al. | 178/7.1 |
| 3,919,469 | 11/1975 | Kasperkovitz | 178/7.1 |

(List continued on next page.)

FOREIGN PATENT DOCUMENTS 9104633  4/1991  PCT Int'l Appl. .

OTHER PUBLICATIONS

Anders, et al., "Developmental Solid State Imaging System," IEEE Transactions on Electron Devices, vol. ED-15, No. 4, Apr. 1968, pp. 191-195.

Dyck and Weckler, "Integrated Arrays of Silicon Photodetectors for Imaging Sensing", IEEE Transactions

(List continued on next page.)

*Primary Examiner*—William Mintel
*Attorney, Agent, or Firm*—D'Alessandro, Frazzini & Ritchie

[57] ABSTRACT

A photosensing pixel element comprises a bipolar phototransistor used as both an integrating photosensor and a select device. The phototransistor is a vertical structure, having as its collector a first doped region of a first conductivity type disposed in a semiconductor substrate or well structure. The base terminal of the bipolar phototransistor comprises a doped region of a second conductivity type disposed within the first doped region and is utilized as the select node for the pixel. Conventional field oxide regions may be employed to isolate the base regions of adjoining phototransistors. A polysilicon line doped to the first conductivity type is disposed over the surface of the semiconductor substrate and is insulated therefrom except in regions where it is in contact with the doped region of a second conductivity type to form an epitaxial emitter for the phototransistor. The polysilicon line also forms the emitter contact for the phototransistor. A plurality of integrating photosensors may be placed in an array of rows and columns, wherein the bases of all bipolar phototransistors in a row are capacitively coupled together to a common row-select line, and the emitters of all bipolar phototransistors in a column are integral with a column sense line. The input of a sense amplifier is connected to the sense line of each column of integrating photosensors. An integrating sense amplifier according to the present invention includes an amplifying element having an inverting input connected to the sense line. A capacitor, preferably a varactor, is also connected between the inverting input and output of the amplifying element. An exponential feedback element may be provided in the sense amplifiers for signal compression at high light levels. The outputs of the sense amplifiers are connected to sample/hold circuits. The rows of the array are selected one at a time and the outputs of the sample/hold circuits for each row are scanned out of the array while the pixel data for the next row are sampled.

19 Claims, 7 Drawing Sheets

U.S. PATENT DOCUMENTS

| | | | |
|---|---|---|---|
| 3,946,151 | 3/1976 | Kamiyama et al. | 178/7.1 |
| 4,139,783 | 2/1979 | Engeler | 307/221 D |
| 4,156,818 | 5/1979 | Collins et al. | 307/221 D |
| 4,224,585 | 9/1980 | Tanaka | 333/165 |
| 4,291,224 | 9/1981 | Shirasu et al. | 250/204 |
| 4,434,441 | 2/1984 | Ishizaki et al. | 358/213 |
| 4,528,684 | 7/1985 | Iida et al. | 377/60 |
| 4,556,800 | 12/1985 | Ohta et al. | 250/578 |
| 4,780,605 | 10/1988 | Tiemann | 250/201 |
| 4,786,818 | 11/1988 | Mead et al. | 250/578 |
| 4,797,560 | 1/1989 | Berger et al. | 250/578 |
| 4,814,846 | 3/1989 | Matsumoto et al. | 357/30 |
| 4,876,534 | 10/1989 | Mead et al. | 340/825.95 |
| 4,906,855 | 3/1990 | Berger et al. | 358/213.23 |
| 4,948,966 | 8/1990 | Arques et al. | 250/208.1 |
| 4,952,788 | 8/1990 | Berger et al. | 250/208.1 |
| 4,959,723 | 9/1990 | Hashimoto | 358/213.11 |
| 5,097,305 | 3/1992 | Mead et al. | |
| 5,132,541 | 7/1992 | Conrads et al. | 257/291 X |

OTHER PUBLICATIONS on Electron Devices, vol. ED-15, No. 4, Apr. 1968, pp. 196-201.

"A Solid-State Image Converter" IEEE Transactions on Electron Devices, Richard Stewart, vol. ED-15, No. 4, Apr. 1968, pp. 220-225.

Tepper, et al., "Transfer Functions of Imaging Mosaics Utilizing the Charge Storage Phenomena of Transistor Structures," IEEE Transactions on Electron Devices, vol. ED-15, No. 4, Apr. 1968, pp. 226-237.

Joy, et al., "Phototransistor Operation in the Charge Storage Mode", IEEE Transactions On Electron Devices, vol. ED-15, No. 4, Apr. 1968, pp. 237-248.

Callahan, et al., "Performance Characteristics of Pulsed Phototransistor Structures Under Various Conditions", IEEE Transactions of Electron Devices, vol. ED-15, No. 4, Apr. 1968, pp. 248-256.

List, "Solid State Imaging-Methods of Approach," IEEE Transactions on Electron Devices, vol. D-15, No. 4, Apr. 1968, pp. 256-261.

Noble, Self-Scanned Silicon Image Detector Arrays, IEEE Transactions on Electron Devices, vol. ED-15, No. 4, Apr. 1968, pp. 202-209.

Soref, "Monolithic Silicon Mosaics for Fae-Infrared Imaging," IEEE Transactions On Electron Devices, vol. ED-5, No. 4, Apr. 1968, pp. 209-214.

Sadasiv, et al., "Thin-Film Circuits for Scanning Image-Sensor Arrays," IEEE Transactions On Electron Devices, vol. ED-15, No. 4, Apr. 1968, pp. 215-219.

HIGH-DENSITY PHOTOSENSOR AND CONTACTLESS IMAGING ARRAY HAVING WIDE DYNAMIC RANGE

RELATED APPLICATIONS

The present application is continuation-in-part of co-pending application Ser. No. 07/923,734, filed Jul. 30, 1992, which is a continuation-in-part of application Ser. No. 07/760,569, filed Sep. 16, 1991, now U.S. Pat. No. 5,260,592, which is a continuation-in-part of co-pending application, Ser. No. 07/657,128, filed Feb. 19, 1991, now U.S. Pat. No. 5,097,305.

BACKGROUND OF THE INVENTION

1. Field of the Invention

The present invention relates to imaging arrays and systems. More particularly, the present invention relates to a single-chip, high-density, high-sensitivity imaging system for producing serial-scanned outputs.

2. The Prior Art

Imaging circuits typically include a two-dimensional array of photosensors, each of which converts a pixel of light energy from an image into an electrical signal representing the light value of the pixel. The imaging circuit scans the photosensors to read out the electrical signals representing the light values of all pixels from an image.

As a result of the advances in semiconductor technology, single chip imaging circuits are known in the art. The most common single-chip imaging technology is the charge coupled device (CCD) camera. A CCD device operates by accumulating photo-generated charge in potential wells in a semiconductor substrate at or slightly under the surface of the substrate. The depth of these wells is controlled by the voltage on gate electrodes located just above the surface of the substrate. By manipulating the voltage on several of the gates, the accumulated charge can be shifted along the surface to a sensing point, where it is amplified into a signal which can be driven off of the chip.

Using modern MOS processing techniques, the transport of charge in a CCD structure can be accomplished with almost perfect efficiency at video rates; typically less than ten parts per million of the charge in a well is lost in each transfer. In a typical serial-scanned CCD imager, such as is used for video applications, the charge is shifted out once per frame, and hence the total charge in each well is collected over the entire frame time, typically 1/60 second. Sensing technologies which operate in this manner, by accumulating charge over the entire time between scanout events, are called integrating photosensors.

Despite its technical achievements and wide spread commercial success, CCD technology has its limitations. Because the photo-generated charge is shifted directly, the gain of the device (electrons out per photon in) is always less than unity. Because the charge stored in each well is limited, the CCD imager has severe dynamic-range constraints. At the low end, the sensitivity is limited by how small a charge can be sensed above the noise of the readout amplifier. At the high end, the range is limited by the total charge that can be shifted from one well into the next.

To overcome these dynamic-range limitations of the CCD imager, a number of attempts have been made to use phototransistors to sense incoming light, such as seen in *Analog VLSI and Neural Systems*, by Carver A. Mead, Addison Wesley Publishing Co., 1989, at pp. 260-261. Phototransistors can have a gain of over 100 electrons per absorbed photon. In a typical application, the photocurrent from each phototransistor is fed into a device with exponential current-voltage characteristics, such as a pair of diode-connected MOS transistors. The output voltage of such a device is then a logarithmic function of the light level. These devices show much wider dynamic range than do CCD devices, but are not as sensitive at low light levels because they operate in instantaneous-current mode rather than in integrating mode.

Photons absorbed in the neighborhood of a phototransistor collector-base or emitter-base junction create electron-hole pairs that are collected by the nearest p-n junction. Minority carriers collected by either junction act as base current, and are multiplied by the current gain of the transistor to produce the collector current. The emitter current is the sum of the base current and the collector current. For this reason, the emitter current is usually used as the output of the sensor.

Prior-art phototransistor sensors suffer from low-current limitations. The current-gain of the phototransistor sensor device is high at high photocurrents, where it is not needed, and is low at low photocurrents, where it would desirably be higher. The current gain at low current is also much more variable than it is at high current. Because of this behavior of phototransistors, they have not found widespread use in commercial scanned imagers.

It is an object of the present invention to provide an improved single-chip serial-scanned imager, which can exhibit higher sensitivity at lower light levels than current mode imagers, and in the same device operate over a dynamic range larger than that achievable with CCD imagers.

BRIEF DESCRIPTION OF THE INVENTION

According to a first aspect of the present invention, a photosensing pixel element comprises a bipolar phototransistor used as both an integrating photosensor and a select device. According to a presently preferred embodiment, the phototransistor is a vertical structure, having as its collector a first doped region of a first conductivity type comprising a semiconductor substrate or well structure. The base terminal of the bipolar phototransistor comprises a doped region of a second conductivity type disposed within the first doped region and is utilized as the select node for the pixel. Conventional field oxide regions may be employed to isolate the base regions of adjoining phototransistors. A polysilicon line doped to the first conductivity type is disposed over the surface of the semiconductor substrate and is insulated therefrom except in regions where it is in contact with the doped region of a second conductivity type to form an epitaxial emitter for the phototransistor. The polysilicon line also forms the emitter contact for the phototransistor.

A plurality of integrating photosensors according to the present invention may be placed in a contactless array of rows and columns, wherein the base terminals of all bipolar phototransistors in a row are capacitively coupled to a common row-select line. The emitter of each bipolar phototransistor forms the output node of the integrating photosensor. The output nodes of all integrating photosensors in a column are connected together by virtue of comprising portions of the same polysilicon column sense line. The array of the present invention thus requires no contacts to either the row line or the column sense line and may be extremely compact.

The integrating photosensor array is coupled to plurality of sense amplifiers, with a sense amplifier input connected to the sense line output of each column of integrating photosensors. An integrating sense amplifier according to the present invention includes an amplifying element having an inverting input connected to the sense line. An MOS balance transistor is connected between the inverting input and the output of the amplifying element and a capacitor, preferably a varactor, is also connected between the inverting input and output of the amplifying element. In addition, in order to further extend the dynamic range, an exponential feedback element can be connected between the output and the inverting input of the amplifying element.

In one embodiment of the invention, this feedback element includes a first P-channel feedback transistor having its source connected to the sense line and its gate and drain connected together to the source of a second P-channel feedback transistor. The gate of the second P-channel feedback transistor is connected to the output of the amplifying element, and its drain is connected to a fixed voltage source, such as ground. In another embodiment of the invention, this feedback element includes an N-channel MOS transistor having its source connected to the output of the amplifying element, its drain connected to the input of the amplifying element, and its gate connected to a source of fixed voltage.

The outputs of the sense amplifiers are connected to a scanning device through sample/hold circuits. The sample/hold circuits store the outputs of each of the sense amplifiers, so that their outputs can be scanned while the charge from the next row of pixels is being sensed.

DETAILED DESCRIPTION OF A PREFERRED EMBODIMENT

Figure 1:
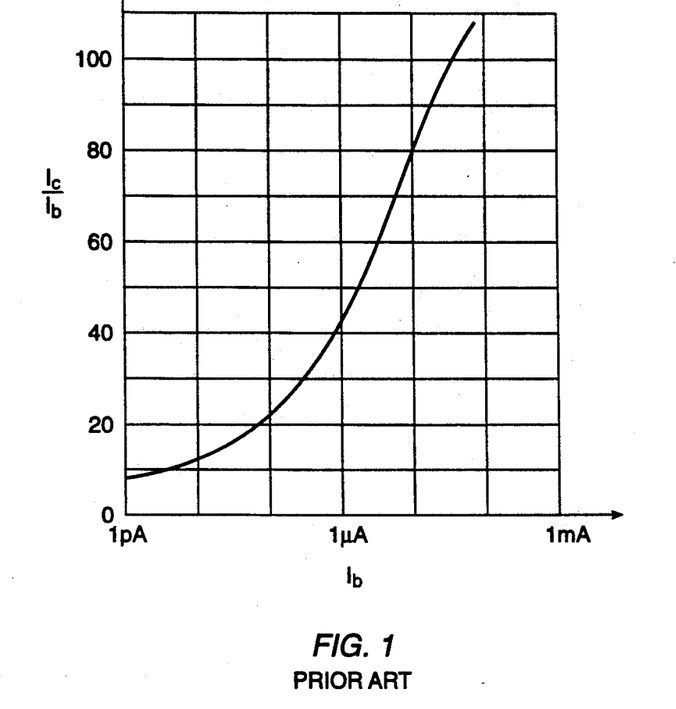
FIG. 1 is a graph showing the measured current gain of a typical phototransistor sensor device as a function of its base current.

The low-current limitation of a prior-art phototransistor photosensor can be appreciated with reference to FIG. 1, which shows the measured current gain of a typical phototransistor sensor device as a function of its base current. It can be seen that the current-gain of the phototransistor photosensor device is high at high photocurrents, where it is not needed, and is low at low photocurrents, where it would desirably be higher. The current gain at low current is also much more variable than it is at high current. Because of this behavior, phototransistors have not found widespread use in commercial scanned imagers.

Figure 2A:
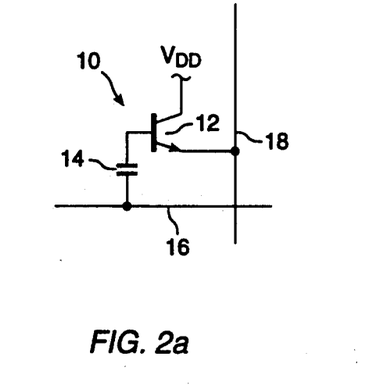
FIG. 2a is a schematic diagram of an integrating photosensor according to a presently-preferred embodiment of the invention.

Referring now to FIG. 2a, a presently preferred pixel integrating photosensor circuit 10 suitable for use in a single-chip integrated circuit imaging array is shown. The photosensor circuit 10 comprises NPN phototransistor 12, having its collector connected to a source of positive voltage, shown as $V_{DD}$ in FIG. 2a. NPN phototransistor 12 preferably has a current gain larger than 100. A capacitor 14 is shown coupling the base of phototransistor 12 to a select line 16.

Coupling the base of phototransistor 12 to a select line 16 allows the phototransistor to also be used as a select device. The emitter of phototransistor 12 is the output of the integrating photosensor and is connected to column sense line 18.

In a preferred implementation of the invention, a plurality of photosensor circuits 10 are formed in an N-well in a standard N-well BiCMOS integrated circuit fabrication process. Because the N-well diffusion covers the entire photosensor array, the individual pixel circuits can be very dense since there are not large well-to-well spacing distances which waste semiconductor substrate area.

Figure 2B:
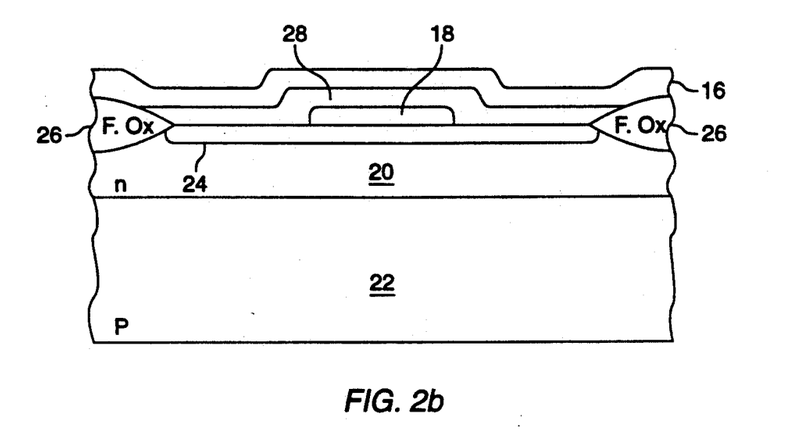
FIG. 2b is a cross sectional view of an embodiment of the circuit of FIG. 2a implemented in an N-well BiCMOS process.

Referring now to FIG. 2b, a cross section of a presently preferred embodiment of a photosensor circuit 10 fabricated according to an N-well BiCMOS process is shown. The entire array of photosensors 10 may be fabricated in N-well 20 formed in semiconductor substrate 22. N-well 20 forms the collector of all phototransistors 12 in the entire photosensor array. The p-base regions 24 of the individual phototransistors 12 are formed by implantation into regions of N-well 20 through apertures between birds beak edges of field oxide regions 26.

A polysilicon layer 18 is grown over the entire surface. Polysilicon layer 18 is n-type doped with a species such as arsenic, to a typical concentration of about $1 \times 10^{21}$ atoms/cm$^3$ using conventional processing technology. Where the polysilicon layer 18 is in contact with the surface of p-type base region 24, it forms an n+ epitaxial region which serves as the emitter of phototransistor 12. It is usually desirable to subject the structure to a subsequent high-temperature step in order to diffuse the n-type dopant a short distance into the p-type base to form the actual emitter junction within the native single crystal region. This procedure results in higher quality junctions with lower leakage currents. The resulting structure will also be referred to herein as an epitaxial emitter. Polysilicon region 18 is patterned into column sense line 18, which contacts the p-base regions of and forms the emitters of all other phototransistors in the same column of an array according to the present invention. Those of ordinary skill in the art will recognize that fabrication of the phototransistor 12 in the manner disclosed herein permits realization of an array even denser than the one disclosed in grandparent application Ser. No. 07/760,569, since no emitter contact apertures and polysilicon openings are needed to connect the emitters of the phototransistors 12 to a column sense line 18.

After polysilicon region 18 is patterned, an interpoly oxide layer 28 is formed over the surface of the polysilicon and the base regions, either by thermal oxidation or by deposition techniques as is well known in the art, and forms the dielectric for capacitor 14, whose plates comprise p-type base region 24 and row-select line 16. Row select line 16 is a polysilicon layer patterned to run orthogonally to column sense line 18. Row-select line 16 is shown in cross section in FIG. 2b. The regions where row-select line 16 lies over interpoly oxide layer 28 and base region 24 comprise capacitor 14 between those two structures. These regions may be seen in FIG. 2b on either side of epitaxial emitter 18.

Those of ordinary skill in the art will realize that, in some process technologies, a silicide layer is formed over the polysilicon layers. Silicided polysilicon is intended to come within the scope of the present invention and is therefore included within the meaning of the word "polysilicon" as used herein.

Those of ordinary skill in the art will recognize that the integrating photosensor of the present invention may easily be integrated using a standard BiCMOS fabrication process. While NPN phototransistors have been used to illustrate the operation of the present invention, those of ordinary skill in the art will recognize that, in a different process, PNP transistors could be employed by appropriately reversing the power supply polarities.

In a typical implementation in a one micron BiCMOS process, NPN phototransistor 12 may have a base region about 3 microns by 2 microns. The entire pixel may be 4.5 microns by 3.5 microns, allowing for an array of much higher density than high-quality CCD imager circuits.

During normal circuit operation, row-select line 16 is held at a fixed voltage. Under this condition, the photocurrent integrates on capacitor 14. When it is desired to read out the state of a selected pixel, the voltage on row-select line 16 is raised, typically by a few volts, thereby forward biasing the base-emitter junction of phototransistor 12. Under this condition, the integrated photocurrent, multiplied by the current gain of phototransistor 12, flows from the emitter of phototransistor 12 onto column sense line 18.

Because the discharge occurs very rapidly, phototransistor 12 is operated at much higher currents than the photocurrent. At this higher current level, the current gain of phototransistor 12 is much higher than unity as shown in FIG. 1 and is much better matched to that of other photosensors in the array. The mode of operation contemplated by the present invention thereby allows many charge carriers to be delivered to sense line 18 for every photo-generated carrier collected by the base. After the discharge has occurred, the row line voltage is lowered to its original value, thus reverse biasing the base emitter junctions of the phototransistors.

Figure 3:
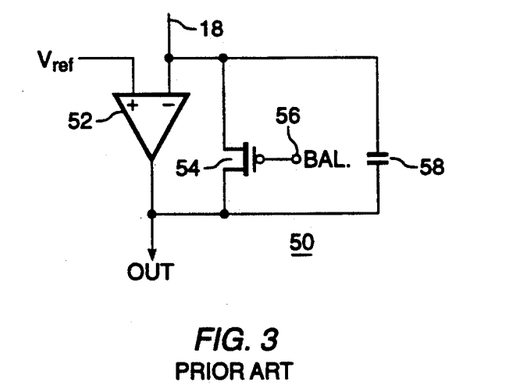
FIG. 3 is a prior-art sense amplifier suitable for use in the present invention.

Referring now to FIG. 3, a typical integrating sense amplifier 50 suitable for sensing the charge delivered to sense line 18 by a single pixel is shown. Sense amplifier 50 includes an amplifying element 52, which may be an operational amplifier. The non-inverting input of amplifier 52 is connected to a source of reference voltage $V_{ref}$ and its inverting input is connected to sense line 18.

A P-channel balance transistor 54 is connected between the inverting input and the output of amplifier 52. Its gate is connected to a BALANCE line 56. A capacitor 58 is also connected between the inverting input and output of amplifier 52. Those of ordinary skill in the art will realize that an N-Channel BALANCE transistor could also be employed requiring reversal of the polarity of the BALANCE signal.

Before row select line 16 is brought high to read a pixel value, amplifier 52 is brought into a known state by bringing the gate of p-channel balance transistor 56 low to turn it on, thereby effectively shorting the inverting input of amplifier 52 to its output and hence driving both input and output voltages to reference voltage $V_{ref}$. The gate of P-channel balance transistor 56 is then brought high, thereby isolating the input sense line 18 from the output of amplifier 52. The pixel is then addressed by bringing its row select line high, thus delivering its stored charge multiplied by the current gain of its phototransistor onto sense line 18.

Amplifier 52 will respond to this charge by maintaining its input at a nearly constant level by the feedback action of capacitor 58. The output voltage of amplifier 52 after the pixel has delivered all of its charge to sense line 18 will be lower than its initial value by that charge divided by the value of capacitor 58. The output of the sense amplifiers will be captured by a sample/hold circuit so that it may be scanned out while the sense amplifiers are sensing charge from the next row of pixels.

Figure 4A:
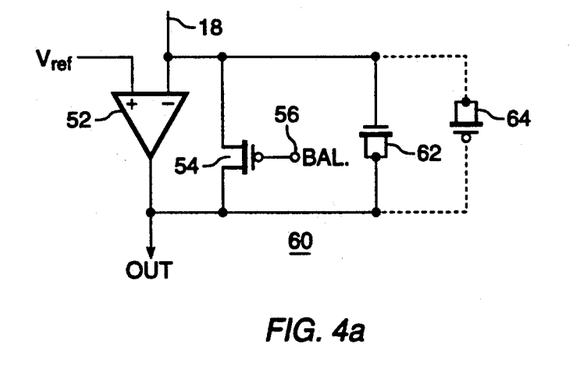
FIG. 4a is a schematic diagram of a presently-preferred sense amplifier for use in the present invention which provides signal compression.

The operation of the imaging array of the present invention at high light levels may be improved by using the sense amplifier shown in FIG. 4a. Sense amplifier 60 includes most of the elements of sense amplifier 50. These elements have been assigned the same reference numerals as the corresponding elements of FIG. 3. Thus, sense amplifier 60 includes an amplifying element 52, having its non-inverting input connected to a source of reference voltage $V_{ref}$ and its inverting input connected to sense line 18. P-channel balance transistor 54 is connected between the inverting input and the output of amplifier 52. Its gate is connected to a BALANCE line 56.

However, in place of capacitor 58, a varactor structure is connected between the inverting input and output of amplifier 52 in the sense amplifier of FIG. 4a. Use of a varactor structure in place of capacitor 58 allows compression of the output signal over a wide dynamic range of input signals. As known in the art, and as illustrated in FIG. 4a, a varactor structure may comprise a large-area MOS transistor. The gate of the MOS transistor comprises one terminal of the varactor structure and the other terminal of the varactor structure comprises the source and drain of the MOS transistor connected together.

Either an N-channel MOS transistor or a P-channel MOS transistor may be used as the varactor according to the present invention. Because, in the presently illustrated application, a positive charge is to be sensed, if an N-channel MOS transistor is used as the varactor as indicated at reference numeral 62, its gate is connected to the input of amplifying element 52 and its source and drain are connected to the output of amplifying element 52. If a P-channel MOS transistor is used as the varactor as indicated at reference numeral 64 in phantom connection, its source and drain are connected to the input of amplifying element 52 and its gate is connected to the output of amplifying element 52. If a charge of the opposite sign is to be sensed, those of ordinary skill in the art will realize that the connections to the varactor will be reversed. If an application requires sensing charge of both polarities, two varactors connected in opposite directions may be used.

Figure 4B:
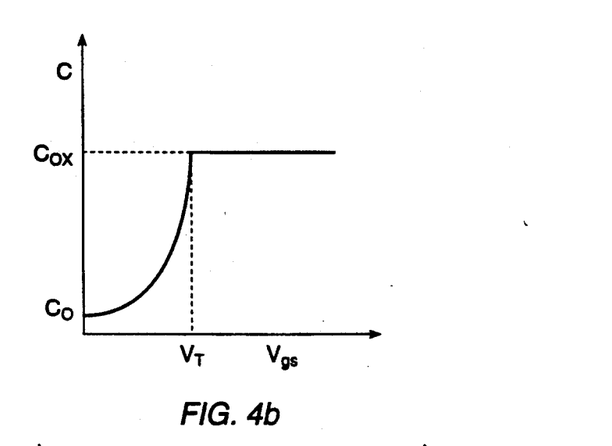
FIG. 4b is a graph showing the capacitance of the varactor structure of the sense amplifier of FIG. 4a as a function of voltage.

Referring now to FIG. 4b, a graph of varactor gate-to-source capacitance as a function of $V_{GS}$, the voltage across the capacitor, it may be seen that the capacitance from one terminal of the varactor structure to its other terminal varies with the voltage across the varactor device. At low gate to source voltages, the capacitance $C_0$ is small and is determined by the overlap of the gate with the source and drain diffusions. As the gate voltage approaches the threshold voltage $V_t$ of the MOS transistor, a channel begins to form under the gate, and the capacitance increases exponentially. Above the threshold voltage, the capacitance reaches the maximum value $C_{ox}$ set by the oxide capacitance of the entire area of the MOS transistor.

According to the present invention, the varactor is oriented in sense amplifier 60 such that the capacitance increases as the input charge increases. For this reason, the output voltage of the sense amplifier 60 per unit photosensor charge is a decreasing function of the total charge sensed. For example, for the NPN phototransistor 12 of FIG. 2a, a positive charge is sensed at the input of sense amplifier 60, causing the amplifier output to go negative from its balanced value. As the source of N-channel varactor 62 is made more negative than the gate, a channel is formed and the gate-to-source capacitance increases.

Figure 5:
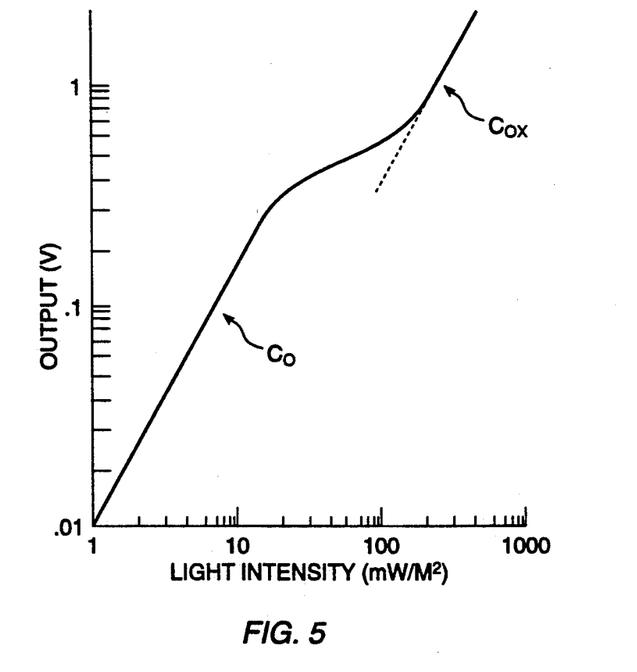
FIG. 5 is a graph showing the output voltage of the sense amplifier of FIG. 4a as a function of light intensity.

Referring now to FIG. 5, a typical graph of the output voltage of the sense amplifier 60 of FIG. 4a is shown as a function of light intensity. The voltage (Y) axis is calibrated in volts and the light-intensity (X) axis is calibrated approximately in mW/meter$^2$. The region past the knee of the curve in the graph of FIG. 5 represents the region where the capacitance of the varactor is increasing towards the value of $C_{ox}$. Varying the size of the varactor device will translate the curve along the X-axis. Reducing the minimum capacitance $C_0$ will translate the lower portion of the curve to the left. The horizontal displacement between the upper and lower portions of the curve of FIG. 5 is equal to the ratio of $C_{ox}$ to $C_0$.

As the level of light intensity is increased further, the upper portion of the curve of FIG. 5 will steepen to a slope of 1 on the log-scale of FIG. 5. The prevent this return to non-compressive behavior, the operation of the imaging array of the present invention at high light levels may be improved by using the sense amplifier shown in FIG. 6a. Sense amplifier 70 includes all of the elements of the sense amplifier 60. These elements have been assigned the same reference numerals as the corresponding elements of FIG. 4a.

Figure 6A:
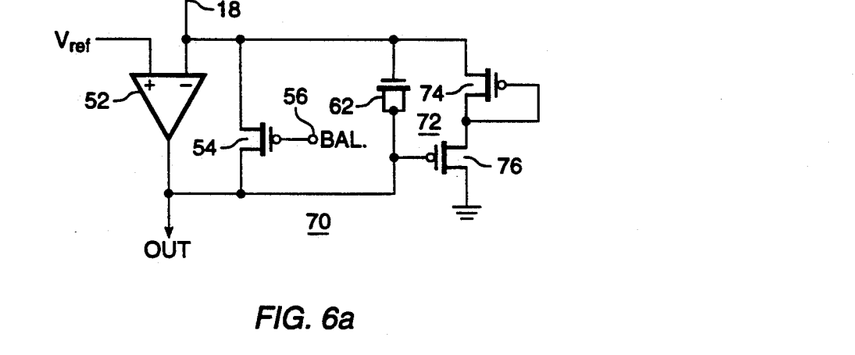
FIG. 6a is a schematic diagram of an alternative sense amplifier for use in the present invention incorporating a first exponential feedback element.

As may be seen from FIG. 6a, in addition to the elements of the sense amplifier circuit 60 of FIG. 4a, sense amplifier 70 includes an exponential feedback element 72. In a first embodiment, exponential feedback element 72 of sense amplifier 70 includes first and second P-channel feedback transistors 74 and 76. First P-channel feedback transistor 74 has its source connected to sense line 18, and its gate and drain connected together to the source of second P-channel feedback transistor 76. The gate of second P-channel feedback transistor 76 is connected to the output of amplifier 52, and its drain is connected to a fixed voltage source, shown as ground in FIG. 6a.

The effect of first and second P-channel feedback transistors 74 and 76 is to provide a current which increases exponentially as the output voltage of amplifier 52 becomes more negative. This exponential function has a very small slope for output voltage excursions less than approximately 1 volt, thereby allowing sense amplifier 70 to function as a normal charge-sensing amplifier at low light levels. However, at higher light levels, by virtue of the current through the exponential element, sense amplifier 70 becomes a current-sensing amplifier, and its output voltage decreases as a logarithmic function of the input current from the pixel.

Those of ordinary skill in the art will recognize that the sense amplifier circuit of FIG. 6a automatically acts as both an integrating detector at low light levels, and as a current-mode detector at high light levels. The dynamic range of an imaging array may be greatly increased by use of the sense amplifier circuit of FIG. 6a.

Figure 6B:
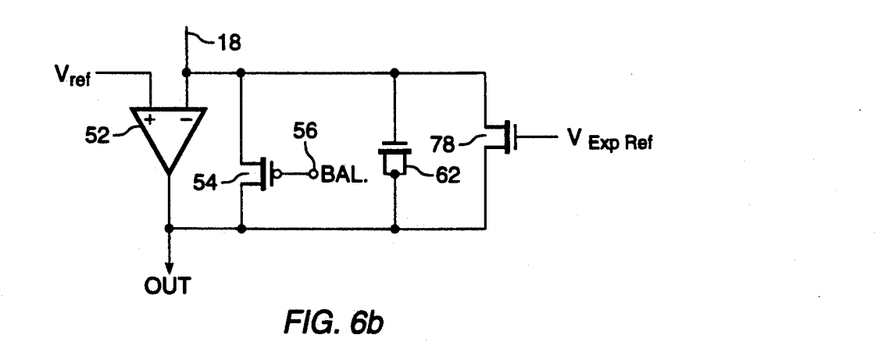
FIG. 6b is a schematic diagram of an alternative sense amplifier for use in the present invention incorporating a second exponential feedback element.

Referring now to FIG. 6b, an alternate embodiment of a sense amplifier with an exponential feedback element to improve its dynamic range is shown. The sense amplifier of FIG. 6b includes all of the elements of sense amplifier 70. These elements have been assigned the same reference numerals as the corresponding elements of FIG. 3. Thus, the sense amplifier of FIG. 6b includes an amplifying element 52, having its non-inverting input connected to a source of reference voltage $V_{ref}$ and its inverting input connected to sense line 18. P-channel balance transistor 54 is connected between the inverting input and the output of amplifier 52. Its gate is connected to a BALANCE line 56. Varactor 62 is connected between the output and inverting input of amplifying element 52.

N-channel MOS transistor 78 is connected as an exponential feedback element with its source connected to the output of amplifying element 52 and its drain connected to the inverting input of amplifying element 52. Its gate is connected to a source of fixed voltage. $V_{Exp\ Ref}$. As more positive charge is sensed by amplifying element 52, its output becomes more negative. As the output decreases below $V_{Exp\ Ref}$, the current through MOS transistor 78 begins to increase exponentially with decreasing output voltage. The amplifier then becomes a current-sensing amplifier with an output voltage logarithmic in input voltage. The magnitude of the fixed voltage source $V_{Exp\ ref}$ should be chosen such that the logarithmic compression occurs just as the varactor has achieved its maximum capacitance $C_{ox}$.

Figure 7A:
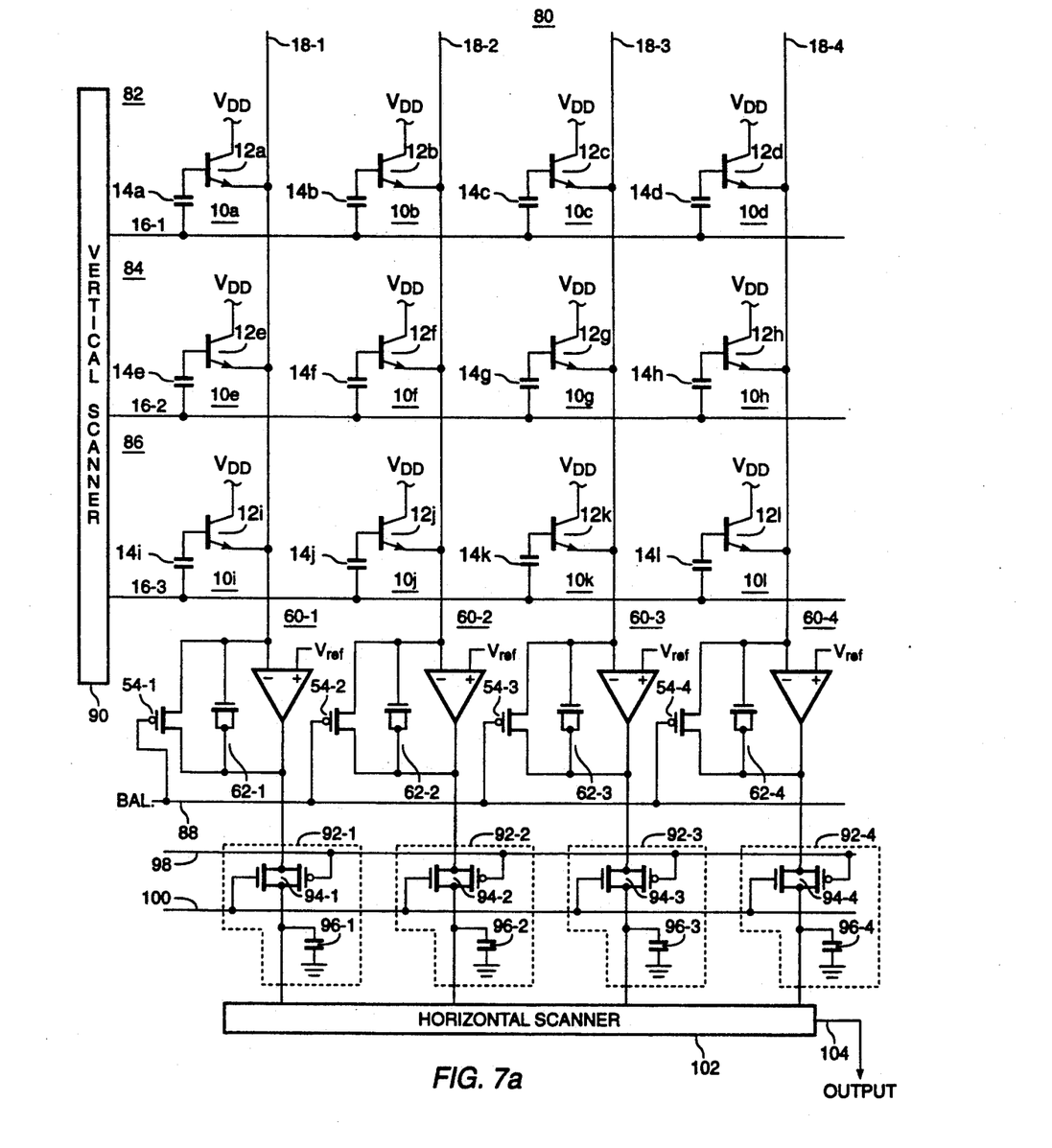
FIG. 7a is a block diagram of an imaging array comprising bipolar transistor integrating photosensors according to a presently preferred embodiment of the invention.

Referring now to FIG. 7a, an integrating imaging array according to a presently preferred embodiment of the invention is illustrated. The array 80 of FIG. 7a is shown including twelve integrating photosensors according to the present invention arranged into three rows and four columns. Those of ordinary skill in the art will readily observe that the embodiment shown in FIG. 7a is illustrative and not limiting in nature, and that an array of any size is contemplated by the present invention, limited only by the inherent density and chip size limitations of BiCMOS technology.

Row 82 of array 80 includes photosensors 10a-10d. Row 84 of array 80 includes photosensors 10e-10h. Row 86 of array 80 includes photosensors 10i-10l. In FIG. 7a, photosensors 10a-10l are illustrated as the bipolar integrating photosensors of FIG. 2a.

First row-select line 16-1 is connected to one plate of capacitors 14a-14d. Second row-select line 16-2 is connected to one plate of capacitors 14e-14h. Third row-select line 16-3 is connected to one plate of capacitors 14j-14l. First sense line 18-1 is connected to the emitters of phototransistors 12a, 12e, and 12i of the first column in the array 80. Second sense line 18-2 is connected to the emitters of phototransistors 12b, 12f, and 12j of the second column in the array 80. Third sense line 18-3 is connected to the emitters of phototransistors 12c, 12g, and 12k of the third column in the array 80. Fourth sense line 18-4 is connected to the emitters of phototransistors 12d, 12h, and 12l of the fourth column in the array 80.

First sense amplifier 60-1 is connected to first sense line 18-1. Second sense amplifier 60-2 is connected to second sense line 18-2. Third sense amplifier 60-3 is connected to third sense line 18-3. Fourth sense amplifier 60-4 is connected to fourth sense line 18-4. As will be apparent from the discussion accompanying FIG. 2a, a row of pixels from array 80 may be read by pulsing balance line 88, followed by bringing the desired one of row-select lines 16-1 through 16-3 to a high logic level. Sense amplifiers 60-1 through 60-4 may be any of the sense amplifiers disclosed herein, or may be any other appropriate sense amplifier which those of ordinary skill in the art will be readily able to select.

In a presently preferred embodiment, a vertical scanning circuit 90 is adapted to select only one of the row-select lines 18 at any given time. Circuits for performing this function are well known in the art.

According to a presently-preferred embodiment of the invention, the outputs of all of the sense amplifiers are captured by sample/hold circuits 92-1 through 92-4 so that they may be scanned out while the sense amplifiers are sensing charge from the next row of pixels. As presently preferred, sample/hold circuits 92-1 through 92-4 may comprise pass gates 94-1 through 94-4 and capacitors 96-1 through 96-4. The N-Channel and P-Channel MOS transistors comprising the pass gates are conventionally driven by complementary signals SAMPLE and SAMPLE! on lines 98 and 100 as is well known in the art. The advantage of employing the sample/hold circuits is that the sense amplifiers have an entire line time to settle, and the residual charge remaining on each row of pixels after sensing is much less than if the amplifier outputs were scanned directly.

As those of ordinary skill in the art will readily appreciate, the timing of the operation of the array of FIG. 7a is straightforward. Vertical scanner 90 selects a one of the rows of pixels. When a particular one of row-select lines 16-1, 16-2, or 16-3 is raised to a positive potential to select a particular row of pixels, a charge Q will be induced in column-sense lines 18-1, 18-2, 18-3, and 18-4 due to its direct capacitance to row line 16 through interpoly oxide 28. After the sense amplifiers 60-1 through 60-4 have settled for most of a row scan time, the row-select line is returned to its original voltage level and a time period is allowed for the sense amplifiers 60-1 through 60-4 to resettle. The low going transition of the row-select line couples an equal and opposite charge Q out of the column sense lines 18-1, 18-2, 18-3, and 18-4, thereby leaving only the charge deposited by photosensor 10. After the sense amplifiers 60-1 through 60-4 have settled from this negative charge increment, the sample signal is asserted, thereby holding the sense amplifier outputs steady for the horizontal scanner 102. Horizontal scanner 102 is then used to scan the output values out of the array. When all row-select signals are low, the BALANCE signal is asserted to bring the sense amplifiers into a known state. Vertical scanner 90 then selects another row and the data acquisition and scanning process repeats until the pixel data for the entire array or selected portion thereof has been read out by horizontal scanner 102.

In a true serial scanned imager, horizontal scanning circuitry 102 is adapted to select the signal from the output of one of sample/hold circuits 92-1 through 92-4 at a given time, to form the output 104 of the array. Exemplary scanning circuits suitable for use as vertical and horizontal scanning circuits 90 and 102 are described in *Analog VLSI and Neural Systems*, by Carver A. Mead, Addison Wesley Publishing Co., 1989, at pp. 263-267. If parallel outputs are desired, all amplifier outputs can be used directly, or subsets can be sequentially selected by horizontal scanning circuit 102.

The sensing scheme of the present invention has several advantages over sensing schemes used in prior-art CCD imagers. Because the amplifiers are re-zeroed each line time, the i/f noise that normally dominates the performance of MOS amplifiers is eliminated. However, because the amplifiers integrate for a substantial fraction of a line time, their effective noise bandwidth is a small fraction of that required of a serial-scan amplifier that must work at the full pixel rate, as will be readily apparent to one of ordinary skill in the art.

Figure 7B:
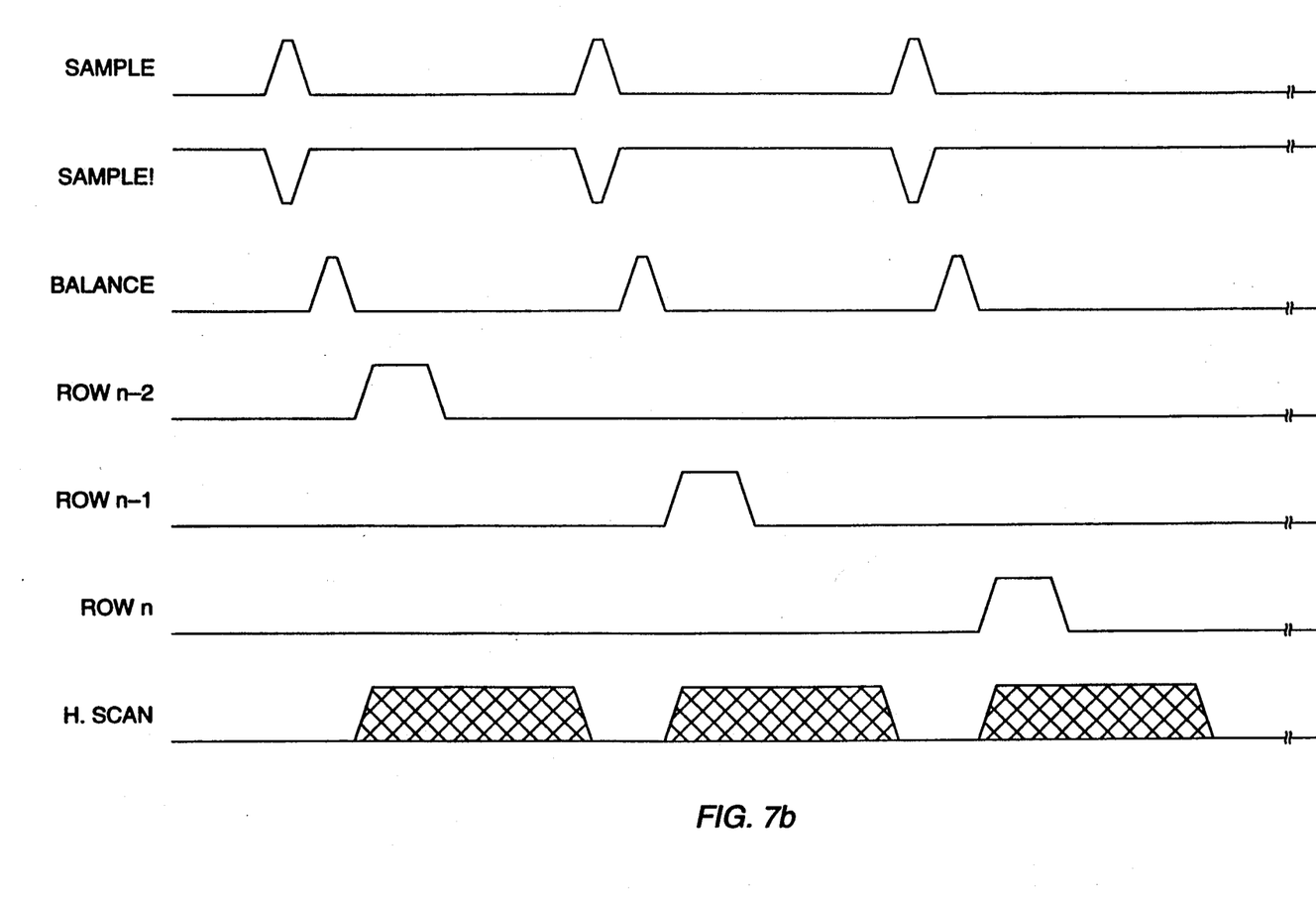
FIG. 7b is a timing diagram of typical control signal waveforms for controlling the operation of an array of the type shown in FIGS. 7a and 7b.

FIG. 7b is a timing diagram showing a typical timing sequence for the signals to row lines, vertical scanner 90, BALANCE signal line 88, SAMPLE line 98 and SAMPLE! line 100, and horizontal scanner 102 during three illustrative row-scan cycles necessary for the operation of a typical array like the ones of FIG. 7a. Circuitry for providing the signals shown in FIG. 7b is conventional and design of such circuitry is well within the level of ordinary skill in the art. From FIG. 7b, it may be seen that the signals driving the row-select lines may come from a serial shift register or a typical one of N decoder circuit. The SAMPLE and SAMPLE! and BALANCE signals are easily derived from the row line drive signals, by, for example, a monostable multivibrator circuit. Note that the horizontal scanner control signal (H. Scan) is shown as a scan period during which either serial scanning, such as by analog multiplexer, or parallel scanning, such as by enabling pass gates, may take place during the period when the H. Scan signal is high. Selection of serial or parallel scanning is a matter of design choice.

Figure 8A:
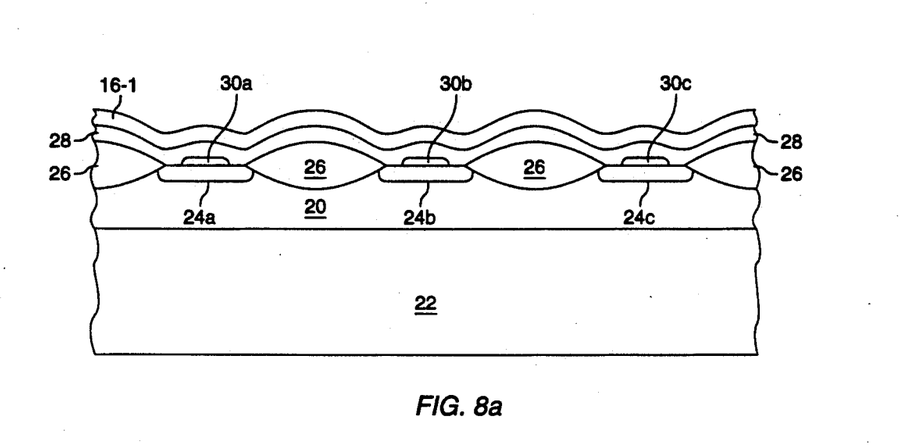
FIG. 8a is a cross-sectional view of a portion of a contactless array of integrating photosensors according to a presently preferred embodiment of the invention implemented in an N-well BiCMOS process taken along an axis parallel to one row thereof in a position which bisects a row-select line of the array.
Figure 8B:
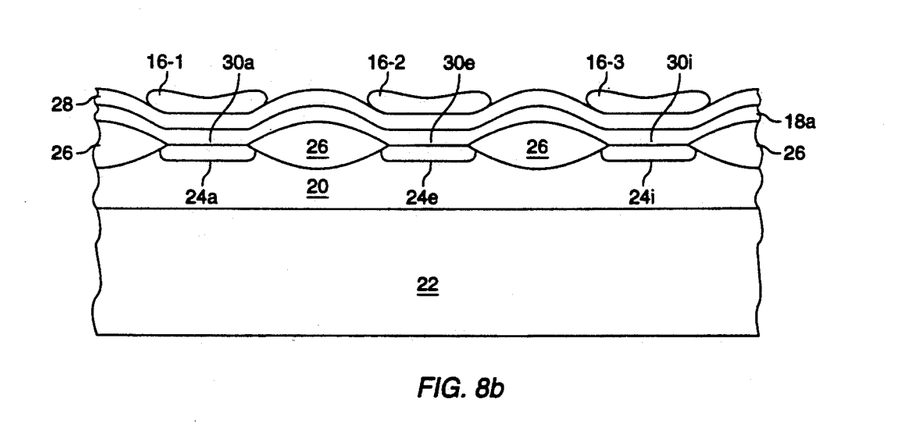
FIG. 8b is another cross-sectional view of the contactless integrating photosensor array shown in FIG. 8a, taken along an axis parallel to a column thereof in a position which bisects a column-sense line of the array.

Referring now to FIGS. 8a and 8b, cross-sectional views of an N-well BiCMOS embodiment of the integrating photosensor array of FIG. 7a using the integrating photosensor of FIGS. 2a and 2b are shown. FIG. 8a is oriented along an axis parallel to the rows of the array. The cross-section of FIG. 8a bisects a row-select line of the array. The axis of FIG. 8b is orthogonal to that of FIG. 8a, and thus runs parallel to a column of the array. The cross-section of FIG. 8b bisects a column sense line of the array. The portion of the array shown in FIGS. 8a and 8b includes three rows and three columns of integrating photosensors.

Those of ordinary skill in the art will readily understand that this embodiment is merely illustrative and that practical arrays fabricated according to the principles of the present invention are likely to be substantially larger. The practical limit on array size is largely a function of BiCMOS processing limitations. The reference numerals used in FIGS. 8a and 8b will be the same as the reference numerals used for the same elements shown in FIGS. 2a and 7a.

In FIG. 8a, array 80 is shown to include an exemplary row 82 of integrating photosensors including photosensors 10a, 10b, and 10c, fabricated in n-well 20, formed in p-type substrate 22 using conventional processing techniques. Although FIG. 7a illustrates a row including four integrating photosensors, only three photosensors 10a, 10b, and 10c are shown for simplicity in row 82 of FIG. 8a. Integrating photosensors 10a, 10b, and 10c may be separated by conventionally formed field oxide regions 26, as is well known in the art. Those of ordinary skill in the art will immediately recognize that region 20 could itself be an n-type semiconductor substrate instead of being an n-well in a p-type semiconductor substrate. This is may be seen in FIGS. 8a and 8b if region 22 is ignored.

P-type base regions 24a, 24b, and 24c, formed in regions of n-well 20 between birds beaks or in apertures etched in a uniformly grown field oxide 26 using known techniques, comprise the base regions of the NPN bipolar transistors comprising integrating photosensors 10a, 10b, and 10c, respectively. The minimum inter-pixel distance is set by the inter-base spacing. The base doping is chosen such that the base surface concentration is larger than the well-surface concentration but light enough so that the base-emitter reverse leakage characteristic is not degraded by incipient breakdown at the reverse bias voltage used for integrating the photo-generated charge.

N-region 20 forms the common collectors for bipolar transistor integrating photosensors 10a, 10b, and 10c, and epitaxial N+ emitter regions 30a, 30b, and 30c formed where polysilicon column sense lines 18a–18c contact base regions 24a, 24b, and 24c to form the emitters of bipolar transistor integrating photosensors 10a, 10b, and 10c, respectively. Conductive row-select line 16-1 comprises a line of conductive material, such as polysilicon, metal silicide or any other conductive layer which may be available in a BICMOS process. Row-select line 16-1 line runs the length of the row 82 over field oxide regions 26 and interpoly oxide layer 28. Typically, a deposited oxide layer is used to cover row-select line 16-1. The portions of column sense lines 18-1, 18-2, and 18-3 are shown in end view in contact with base regions 24a, 24b, and 24c, in regions where they comprise epitaxial emitters 30a, 30b, and 30c of integrating photosensors 10a, 10b and 10c, respectively.

FIG. 8b is a cross-sectional view taken along the first column of array 80 in a location which bisects column sense line 18-1 of FIG. 7a. Polysilicon column sense line 18-1 is shown running the length of the column and comprising epitaxial emitter regions 30a, 30e, and 30i of integrating photosensors 10a, 10e, and 10i where it contacts base regions 24a, 24e, and 24i.

From an examination of FIGS. 8a and 8b, those of ordinary skill in the art will recognize that a first major advantage of the contactless photosensor and imaging array of the present invention over prior-art CCD imagers is that, for a given set of process geometric design rules, the area required per photosensor is less than one tenth that required by a high-quality CCD imager. This smaller pixel area translates directly into the ability to employ a smaller capacitance per pixel. Such skilled persons will also recognize the improvement of area-utilization of the array of the present invention over the array disclosed in FIGS. 8a and 8b of co-pending application Ser. No. 07/760,569 because of the elimination of the emitter contact and its required area.

A major advantage of the array of the present invention is its low power dissipation. In a prior-art buried channel CCD imager array, four gate lines crossing the entire chip must be charged and discharged to voltages in the 15 volt range every line time. An energy equal to $\frac{1}{2}CV^2$ is expended with each transition. In the array of the present invention, a single line across the chip is charged and discharged to a voltage of about 3 volts each line time. The lower operating voltage and smaller number of clock signals, together with the smaller capacitance per pixel, allows the array of the present invention to operate with less than 1/100 of the power dissipation of the prior-art CCD arrays.

While a presently-preferred embodiment of the invention has been disclosed, those of ordinary skill in the art will, from an examination of the within disclosure and drawings be able to configure other embodiments of the invention. For example, those of ordinary skill in the art will readily observe that the array of the present invention may be rearranged by a simple rotation to interchange the roles of its rows and its columns, or two such arrays can be interspersed on offset centers to form a hexagonal, rather than a square, array. The invention may be easily fabricated in a P-well BiCMOS process, and that, in such an embodiment, the voltage levels and power supplies would be reversed. These other embodiments are intended to fall within the scope of the present invention which is to be limited only by the scope of the appended claims.

What is claimed is:

1. A bipolar phototransistor pixel element disposed on a piece of semiconductor material of a first conductivity type comprising:

a collector comprising a region of semiconductor material;

a base comprising a doped region of a second conductivity type disposed within said collector region;

a polysilicon region doped to said first conductivity type and disposed over a portion of said base to comprise an epitaxial emitter for the phototransistor and a sense node for said pixel element; and an insulating layer disposed over said polysilicon region and over the portion of said base not covered by said polysilicon region; and a layer of conductive material disposed over said insulating layer and thereby capacitively coupled to said base to form a select node for said pixel element.

2. The bipolar phototransistor pixel element of claim 1 wherein said piece of semiconductor material of said first conductivity type comprises a well region in a semiconductor substrate of said second conductivity type.

3. A bipolar phototransistor pixel element disposed on a piece of n-type semiconductor material comprising:
- a collector comprising a region of said semiconductor material;
- a base comprising a p-type doped region disposed within said collector region;
- an n-type doped polysilicon region disposed over a portion of said base to comprise an epitaxial emitter for the phototransistor and a sense node for said pixel element; and
- an insulating layer disposed over said polysilicon region and over the portion of said base not covered by said polysilicon region; and
- a layer of conductive material disposed over said insulating layer and thereby capacitively coupled to said base to form a select node for said pixel element.

4. The bipolar phototransistor pixel element of claim 3 wherein said n-type piece of semiconductor material comprises a well region in a p-type semiconductor substrate.

5. An integrating imaging array disposed on a single piece of semiconductor substrate material, including:
- a plurality of integrating photosensors arranged in an array of at least one row and at least one column, each of said photosensors comprising a bipolar phototransistor having a collector connected to a fixed voltage source, a base connected to one end of a capacitor, the other end of said capacitor connected to a select node, and an emitter;
- a plurality of row lines, each one of said row lines associated with a different row in said array, each of said row lines connected to the select nodes of all of the integrating photosensors associated with its row; and
- a plurality of sense lines, each one of said sense lines associated with a different column in said array and comprising a doped polysilicon line, regions of said doped polysilicon line in contact with the base regions of all of said phototransistors in its column to form said emitters thereof.

6. The array of claim 5, further including:
- a plurality of sense amplifiers, each one of said sense amplifiers associated with a different column of said array, each of said sense amplifiers having an input and an output, the input of each of said sense amplifiers connected to the one of said sense lines associated with its column; and
- means for placing a signal on a selected one of said row lines to activate the select nodes of the integrating photosensors associated with said selected one of said row lines.

7. The array of claim 6 further including:
- a plurality of sample/hold circuits, each one of said sample/hold circuits associated with a different column of said array, each of said sample/hold circuits having a control input, a data input and a data output, the data input of each of said sample/hold circuits connected to the output of the one of said sense amplifiers associated with its column; and
- means for selectively activating the control inputs of said sample/hold circuits.

8. The integrating imaging array of claim 7, further including:
- means for serially selecting each of said rows in order; and
- means for serially selecting the outputs of said sample/hold circuits when each of said rows has been selected.

9. The integrating imaging array of claim 6, further including means for adapting said amplifier to a known state when none of said rows are selected.

10. The integrating imaging array of claim 6 wherein each of said sense amplifiers includes an inverting input and further includes means for selectively connecting its output to its inverting input.

11. The integrating imaging array of claim 10 wherein said means for selectively connecting comprises an MOS transistor connected between said input node and said output node, said MOS transistor having its gate connected to a balance input node.

12. An integrating imaging array disposed on a single piece of semiconductor material of a first conductivity type, including:
- a plurality of integrating photosensors on said piece of semiconductor material, said plurality of integrating photosensors arranged in a matrix including at least one row and at least one column, each of said integrating photosensors comprising a bipolar phototransistor having a collector comprising a collector region of said semiconductor material, a base region formed from a region of a second conductivity type disposed in said collector region of said semiconductor material, the base regions of adjacent ones of said integrating photosensors electrically isolated from one another, said piece of semiconductor material connected to a voltage source;
- a plurality of polysilicon sense lines doped to said first conductivity type, a different one of said sense lines associated with each of said columns in said array, each of said polysilicon sense lines oriented such that it is in contact with a portion of the base regions of all the bipolar phototransistors associated with its column so as to comprise epitaxial emitters thereof;
- a capacitor dielectric layer formed over said polysilicon sense lines and the portions of the base regions of all of said phototransistors not covered by said sense lines;
- a plurality of row lines disposed over and insulated from said polysilicon sense lines, each of said row lines oriented in a direction substantially orthogonal to said polysilicon sense lines, a different one of said row lines associated with each row in said array, each of said row lines comprising a conductive strip disposed over said capacitor dielectric layer and capacitively coupled to said portions of said base regions not covered by said sense lines in the phototransistors in the one of said rows with which it is associated.

13. An integrating imaging array of claim 12 wherein said piece of semiconductor material is a well region disposed in a semiconductor substrate of said second conductivity type.

14. The integrating imaging array of claim 12, further including:
- a plurality of sense amplifiers, a different one of said sense amplifiers associated with each column in said array, each of said sense amplifiers having an input and an output, the input of each one of said sense amplifiers connected to the one of said sense lines associated with its column; and means for placing a signal on a selected one of said row lines to forward bias the base regions of the integrating photosensors associated with said selected one of said row lines.

15. The integrating imaging array of claim 14, further including:
a plurality of sample/hold circuits, each one of said sample/hold circuits associated with a different column of said array, each of said sample/hold circuits having a control input, a data input and a data output, the data input of each of said sample/hold circuits connected to the output of the one of said sense amplifiers associated with its column; and
means for selectively activating the control inputs of said sample/hold circuits.

16. The integrating imaging array of claim 15, further including:
means for serially selecting each of said rows in order; and
means for serially selecting the outputs of said sample/hold circuits when each of said rows has been selected.

17. The integrating imaging array of claim 14, further including means for adapting said amplifier to a known state when none of said rows are selected.

18. The integrating imaging array of claim 14 wherein each of said sense amplifiers includes an inverting input and further includes means for selectively connecting its output to its inverting input.

19. The integrating imaging array of claim 18 wherein said means for selectively connecting comprises an MOS transistor connected between said input node and said output node, said MOS transistor having its gate connected to a balance input node.

* * * * *

UNITED STATES PATENT AND TRADEMARK OFFICE
CERTIFICATE OF CORRECTION

PATENT NO. : 5,289,023
DATED : February 22, 1994
INVENTOR(S) : Carver A. Mead

It is certified that error appears in the above-indentified patent and that said Letters Patent is hereby corrected as shown below:

Column 4, line 50, change "not" to --no--,

Column 11, line 14, change "2a" to --2b--,

Column 11, line 53, change "BICMOS" to --BiCMOS--.

Signed and Sealed this

Twentieth Day of December, 1994

Attest:

BRUCE LEHMAN

Attesting Officer   Commissioner of Patents and Trademarks